(12) United States Patent
Mansor et al.

(10) Patent No.: US 11,195,786 B1
(45) Date of Patent: Dec. 7, 2021

(54) BALL GRID ARRAY SUBSTRATE

(71) Applicant: Western Digital Technologies, Inc., San Jose, CA (US)

(72) Inventors: Muhammad Bashir Mansor, Kubang Semang (MY); Chong Un Tan, Seremban (MY); Shivaram Sahadevan, Kulim (MY); Mickaldass Santanasamy, George Town (MY); Muhammad Faizul Mohd Yunus, Simpang Ampat (MY); Chin Koon Tang, Bayan Lepas (MY)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/893,016

(22) Filed: Jun. 4, 2020

(51) Int. Cl.
*H01L 23/498* (2006.01)
*H01L 23/00* (2006.01)

(52) U.S. Cl.
CPC ........ *H01L 23/49816* (2013.01); *H01L 24/32* (2013.01); *H01L 2924/15311* (2013.01); *H01L 2924/15321* (2013.01)

(58) Field of Classification Search
CPC ............... H01L 23/49816; H01L 24/32; H01L 2924/15311; H01L 2924/15321
USPC .......................................................... 438/122
See application file for complete search history.

(56) References Cited

U.S. PATENT DOCUMENTS

| | | | |
|---|---|---|---|
| 5,892,290 A | 4/1999 | Chakravorty et al. | |
| 6,444,497 B2 | 9/2002 | Wensel et al. | |
| 6,953,893 B1 | 10/2005 | Kuzmenka | |
| 6,989,606 B2 | 1/2006 | Cheng et al. | |
| 8,561,880 B2 * | 10/2013 | Gruber | B22D 25/02 228/256 |
| 8,922,002 B2 * | 12/2014 | Kweon | H01L 24/94 257/734 |
| 2003/0205799 A1 | 11/2003 | Yunus | |
| 2015/0221614 A1* | 8/2015 | Sutardja | H01L 25/0657 257/675 |
| 2019/0103388 A1* | 4/2019 | Kim | H01L 25/18 |

* cited by examiner

*Primary Examiner* — Vu A Vu
(74) *Attorney, Agent, or Firm* — Kunzler Bean & Adamson, PC (57) ABSTRACT

A semiconductor device package includes an embedded plurality of solder balls within an integrated circuit die (ICD) substrate In one embodiment, the integrated circuit die (ICD) substrate has a top surface and a bottom surface, and a plurality of solder balls at least partially embedded in the ICD substrate, where each of the plurality of solder balls comprises an exposed surface that is substantially flat and parallel planar to the bottom surface, and where the exposed surface of each of the plurality of solder balls is disposed in the bottom surface. In certain examples, the apparatuses also include a plurality of integrated circuit dies stacked on the top surface of the ICD substrate.

18 Claims, 7 Drawing Sheets

BALL GRID ARRAY SUBSTRATE

TECHNICAL FIELD

The present disclosure, in various embodiments, relates to integrated circuit packaging and more particularly relates to an integrated circuit die substrate.

BACKGROUND

The term "die" in the field of integrated circuits refers to a small block of semiconducting material, on which a circuit is fabricated. Typically a die is manufactured as part of a single wafer that includes a multiple individual dies in which fabrication techniques (e.g., deposition, removal, patterning, etc.) are utilized to form components and features of each die. Each die is connected to a package that allows the packaged die or "chip" to be connected to a circuit board or other suitable device. During package assembly, problems associated with the solder ball attach process greatly affect the overall yield and cycle time.

SUMMARY

Apparatuses are presented for an embedded plurality of solder balls within an integrated circuit die (ICD) substrate In one embodiment, the integrated circuit die (ICD) substrate has a top surface and a bottom surface, and a plurality of solder balls at least partially embedded in the ICD substrate, where each of the plurality of solder balls comprises an exposed surface that is substantially flat and parallel planar to the bottom surface, and where the exposed surface of each of the plurality of solder balls is disposed in the bottom surface. In certain examples, the apparatuses also include a plurality of integrated circuit dies stacked on the top surface of the ICD substrate.

Systems are presented for embedded solder balls in an integrated circuit die substrate. In one embodiment, the system includes the integrated circuit die (ICD) substrate that has a top surface for supporting a plurality of integrated circuit dies, and a bottom surface. The system also includes, in certain examples, a plurality of solder balls or bumps at least partially embedded in the ICD substrate, where each of the plurality of solder balls comprises an exposed surface that is substantially flat and parallel planar to the bottom surface, and where the exposed surface of each of the plurality of solder balls is disposed in the bottom surface. The system may also include a printed circuit board (PCB) substrate having a plurality of cavities configured to store flux, and a die attach film (DAF) tape layer disposed between the ICD substrate and the PCB substrate.

Other apparatuses are presented for ICD substrates with embedded solder balls. In one embodiment, an apparatus includes means for supporting a plurality of integrated circuit dies. An apparatus, in certain examples, includes means for exposing a surface of each of a plurality of solder balls that are embedded within the means for supporting the plurality of integrated circuit dies. In certain examples, each surface of the plurality of solder balls is substantially flat and is disposed in a bottom surface of the means for supporting a plurality of integrated circuit dies. An apparatus, in certain examples, includes means for storing flux in a plurality of cavities, and means for adhering the means for supporting a plurality of integrated circuit dies to the means for storing flux.

A method is also presented and includes providing an integrated circuit die (ICD) substrate comprising a plurality of solder balls that are each at least partially embedded in the ICD substrate. The method, in certain examples, includes providing a printed circuit board (PCB) substrate comprising a plurality of cavities, each of the plurality of cavities having flux. The method may also include thermally reacting each of the plurality of solder balls with the flux of a corresponding one of the plurality of cavities to electrically couple the ICD substrate with the PCB substrate.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Aspects of the present disclosure may be embodied as an apparatus, system or method. Accordingly, aspects of the present disclosure may take the form of an entirely hardware embodiment or an embodiment combining software and hardware aspects that may all generally be referred to herein as a "circuit," "module," "apparatus," or "system."

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, dies, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, dies, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, dies, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, dies, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, dies, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1A:
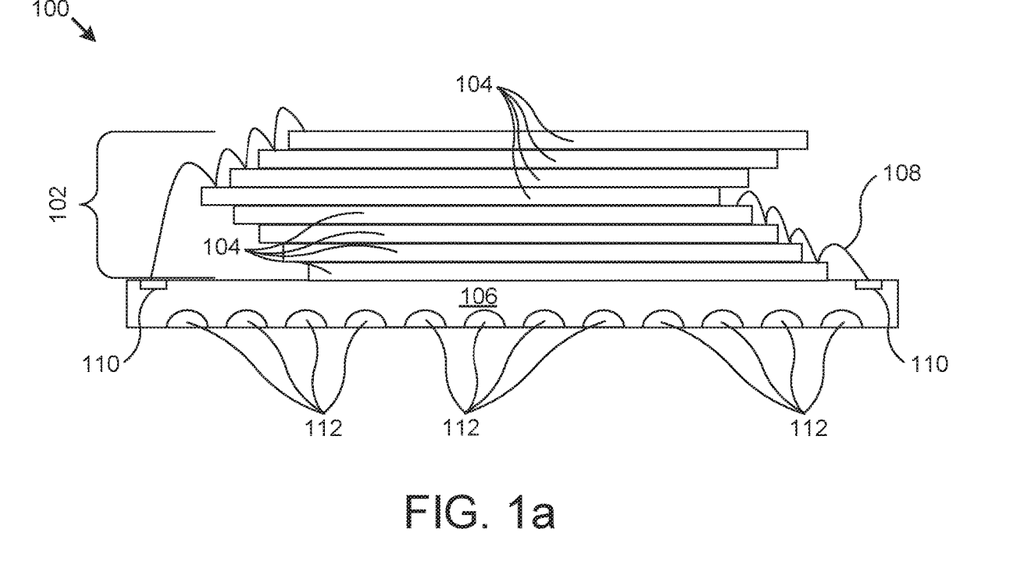
FIG. 1a is a schematic block diagram illustrating a side view of a system having an integrated circuit die (ICD) substrate, according to examples of the subject disclosure.

FIG. 1a is a schematic block diagram illustrating a side view of a system 100 having an integrated circuit die (ICD) substrate 106, according to examples of the subject disclosure. The ICD substrate 106 is configured to support a plurality 102 of stacked integrated circuit dies. An integrated circuit die 104, as used herein, comprises one or more fabricated electrical circuits and/or other electrical components (e.g., a monolithic integrated circuit or the like). For example, an integrated circuit die 104 may comprise a semiconductor device (e.g., silicon, gallium arsenide, or the like) with one or more gates, transistors, capacitors, resistors, diodes, power supplies, amplifiers, traces, vias, other electrical connections, electrical contacts, and/or other integrated electrical components. The integrated circuit die 104 may be fabricated using a photolithographic and/or chemical process in which one or more layers of semiconductors, metals or other conductors, insulators, or the like are deposited on and/or removed from a semiconductor substrate to form electrical circuits.

Multiple chips, die planes, dies and/or other integrated circuit dies 104, in one embodiment, may be stacked or otherwise combined in a multi integrated circuit die 104 arrangement. For example, multiple integrated circuit dies 104 may be stacked and laterally offset relative to adjacent integrated circuit dies 104, to provide room for electrical connections. In some embodiments, multiple integrated circuit dies 104 may be coupled, either directly or indirectly, to the same ICD substrate 106 or chip carrier and may communicate with each other through the ICD substrate 106 and/or chip carrier. Multiple integrated circuit dies 104 may be disposed within the same package and/or housing (e.g., for protection, mechanical support, or the like), such as a resin, plastic or other polymer, ceramic, and/or other sturdy material that houses and/or encapsulates the integrated circuit dies 104, with one or more electrical traces, pins, contacts, or the like extending from the integrated circuit dies 104 through the package or other housing for external electrical communications out of the package.

Each of the integrated circuit dies 104, in certain examples, is electrically connected to the ICD substrate 106 by, for example, a bonding wire 108 which connects to the electrical contact 110. As used herein, the electrical contacts 110 comprise a conductive connection, such as metallic or otherwise conductive pad, pin port, trace, pillar, or the like. The electrical contacts 110 may be electrically and/or mechanically coupled using solder, conductive wires, ports, clamps, clips, or the like. In the depicted embodiment, the electrical contacts 110 are electrically and/or mechanically coupled to electrical contacts of a PCB substrate (see FIGS. 2a and 2b) using a grid array of solder balls 112 that are embedded in the ICD substrate 106. Embedded solder balls 112 overcome many deficiencies of surface-mounted solder balls including, but not limited to, missing balls, dented balls, bridging between balls, inconsistent ball size, and ball contamination. Additional benefits of embedded solder balls 112 include eliminating steps in the manufacturing of the system 100, improving die yield by eliminating the above-mentioned ball defects, and eliminating solder paste printing process on the PCD substrate by implementing embedded flux.

Figure 1B:
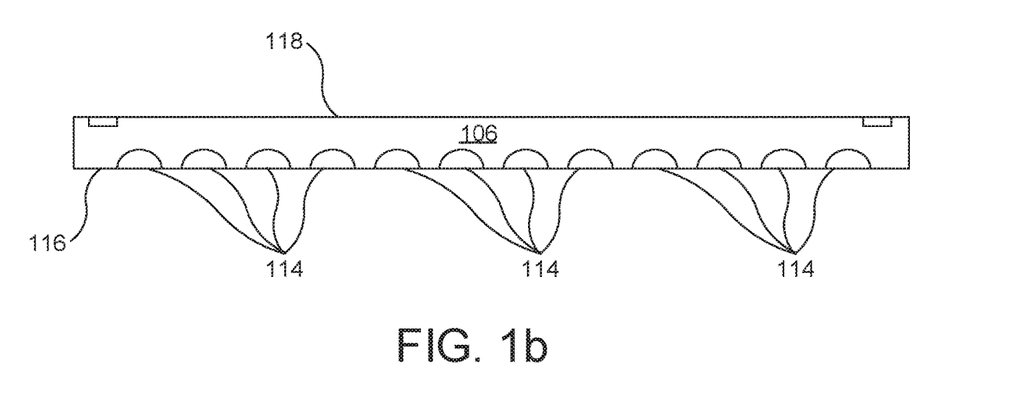
FIG. 1b is a schematic block diagram illustrating a side view of the ICD substrate, according to examples of the subject disclosure.

FIG. 1b is a schematic block diagram illustrating a side view of the ICD substrate 106, according to examples of the subject disclosure. The ICD substrate 106, as discussed above, is formed with a grid array of solder balls 112, also known as a ball grid array (BGA). The solder balls 112 can be part of the ball grid array for mounting the ICD substrate 106 on to a printed circuit board. The grid array of the ICD substrate 106 may include any reasonable number of solder balls 112. The depicted number of solder balls 112 is for illustrative purposes only, and the actual quantity may vary without departing from the scope of the subject disclosure. The solder balls 112, in certain examples, are embedded within the body of the ICD substrate 106. Each solder ball 112 includes an exposed surface 114 that is substantially co-planar with a bottom surface 116 of the ICD substrate 106. The ICD substrate 106 is also formed with a top surface 118 to which the integrated circuit dies 104 are coupled.

In certain examples, the solder balls 112 are formed as part of the manufacturing process of the ICD substrate 106. For example, openings, or cavities in the ICD substrate 106 may be formed using various lithography techniques and a solder material is deposited in those openings to form the solder balls 112. In alternative examples, the ICD substrate 106 may be deposited, by chemical vapor deposition for example, around a grid array of solder balls 112. In other examples, solder balls 112 are completely embedded within the ICD substrate 106 and a grinding process removes a portion of the ICD substrate 106 until the exposed surfaces 114 of the solder balls 112 are exposed. In such a grinding process, the solder balls 112 are "flattened" to form the flat and parallel planar surfaces to the bottom surface 116 of the ICD substrate 106.

Figure 2A:
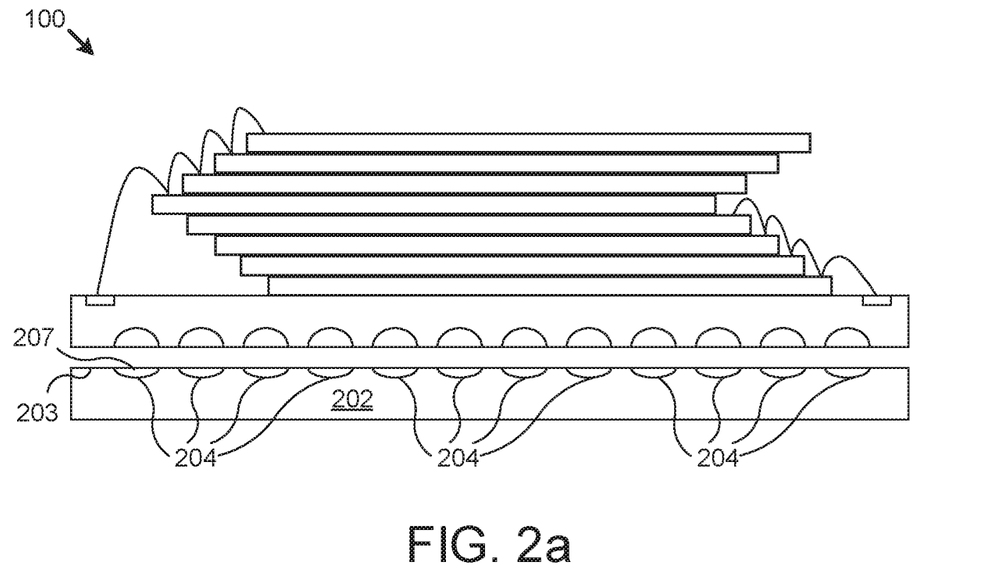
FIG. 2a is a schematic block diagram of the system and a PCB substrate, according to examples of the subject disclosure.

FIG. 2a is a schematic block diagram of the system 100 and a PCB substrate 202, according to examples of the subject disclosure. The PCB substrate 202, in certain examples, is formed with a top surface 203 having a plurality of cavities 204 or depressions for maintaining flux. The flux functions as a cleaning agent, flowing agent, and purifying agent. The plurality of cavities 204, in some examples, are arranged in a grid array that corresponds to and aligns with the plurality of solder balls 112 of the ICD substrate 106 so that when the ICD substrate 106 is properly aligned with the PCB substrate 202, electrical connections are formed between the integrated circuit dies 104 and devices of the printed circuit board. The flux may be a solid, a liquid, or a paste. When flux is disposed within the cavities 204, the flux forms an exposed flux surface 207 that is substantially parallel planar to the top surface 203 of the PCB substrate 202.

Figure 2B:
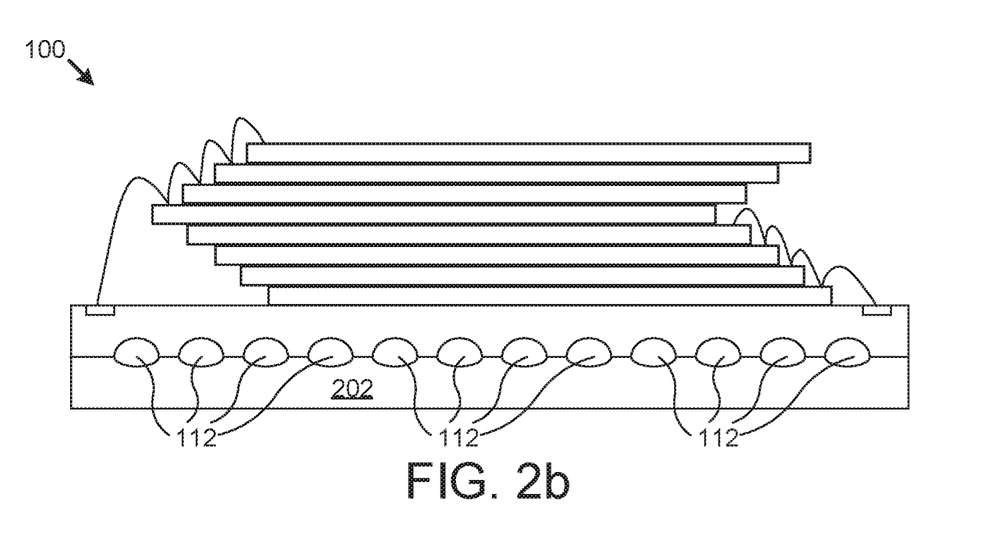
FIG. 2b is a schematic block diagram of the system joined with the PCB substrate, according to examples of the subject disclosure.

FIG. 2b is a schematic block diagram of the system 100 joined with the PCB substrate 202, according to examples of the subject disclosure. Upon application of heat, such as a reflow operation, the embedded solder balls 112 with start to react with the flux of the PCB substrate 202 and form an electrical connection between the ICD substrate 106 and the PCB substrate 202. In certain examples, the flux is embedded during manufacture of the PCB substrate 202. In other examples, the flux is deposited prior to the reflow operation.

Figure 3A:
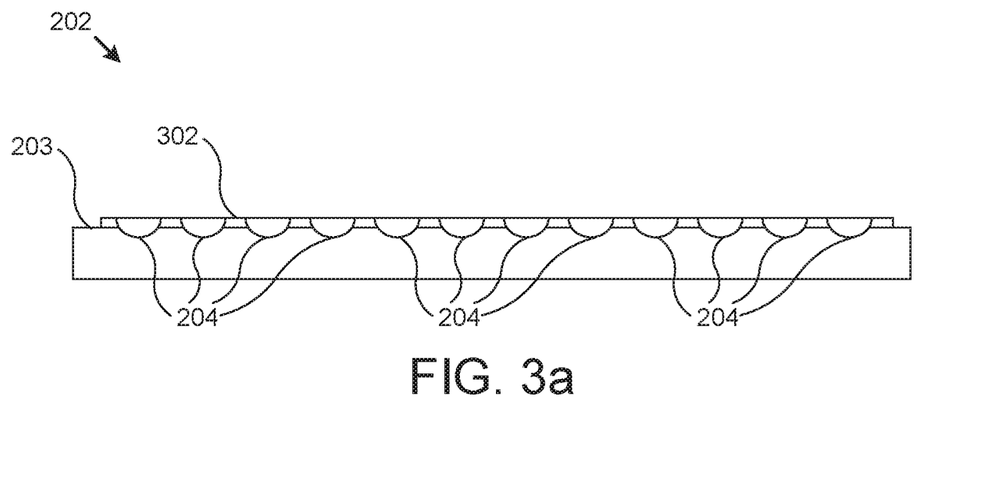
FIG. 3a is a schematic block diagram of the PCB substrate, according to examples of the subject disclosure.

FIG. 3a is a schematic block diagram of the PCB substrate 202, according to examples of the subject disclosure. The PCB substrate 202, in certain examples, includes a die attach film (DAF) tape layer 302 disposed on the top surface 203. The DAF tape layer 302 is used to preliminarily attach the PCB substrate 202 to the ICD substrate 106. Beneficially, this allows for the elimination of manufacturing issues such as solder bridging and improper ball connection, improves the BGA Board Level Reliability (BLR) life cycle, eliminates solder paste printing processes on the ICD substrate 106, improves product yield, and eliminates underfill (e.g. epoxy) processes. As one example, the DAF tape layer 302 may be an epoxy cured to a B-stage to preliminarily affix the PCB substrate 202 to the ICD substrate 106, and later cured to a C-stage to permanently affix the PCB substrate 202 to the ICD substrate 106.

Figure 3B:
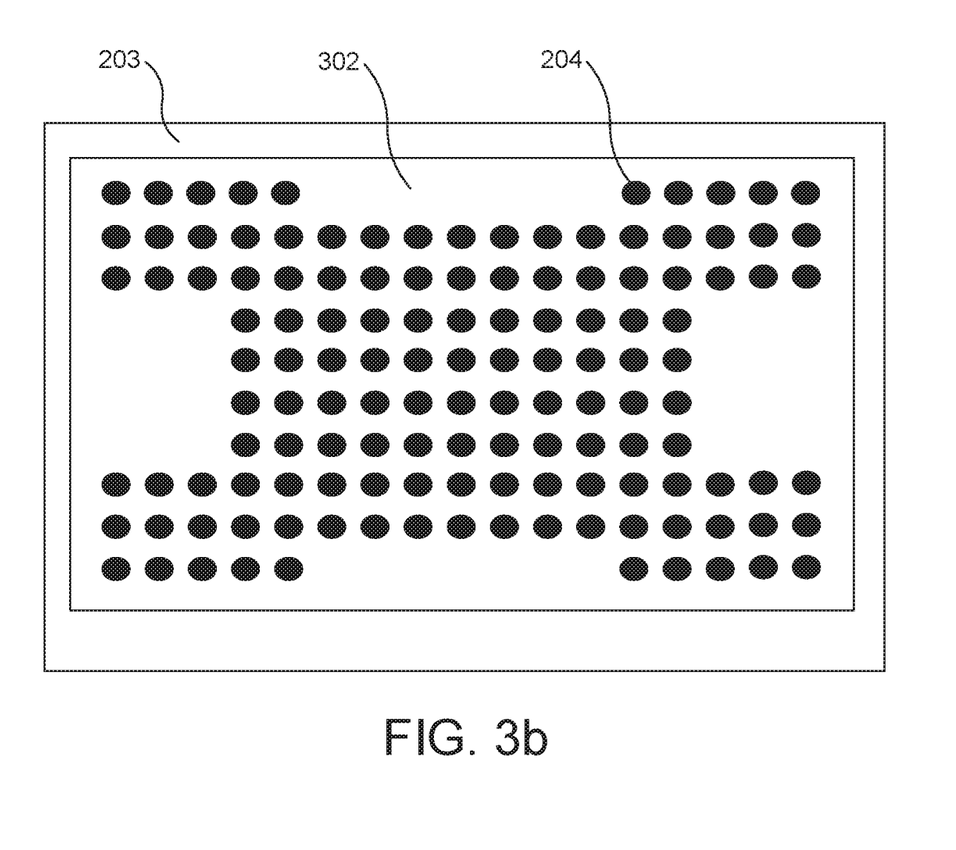
FIG. 3b is a schematic block diagram of a top view of the PCB substrate, according to examples of the subject disclosure.

FIG. 3b is a schematic block diagram of a top view of the PCB substrate 202, according to examples of the subject disclosure. In the depicted example, the top surface 203 of the PCB substrate 202 is shown with the plurality of cavities 204 arranged in a grid array (although only a single cavity is identified by reference number 204, for clarity). It is contemplated that any configuration and number of cavities 204 is possible. A similar grid array of solder balls 112 is formed in the bottom surface 116 of the ICD substrate 106. In certain examples, the DAF tape layer 302 is disposed on the top surface 203 of the PCB substrate 202. The DAF tape layer 302 may have a plurality of openings that correspond with the plurality of cavities 204 so that the flux contained within the cavities is exposed to the solder balls 112.

Figure 4:
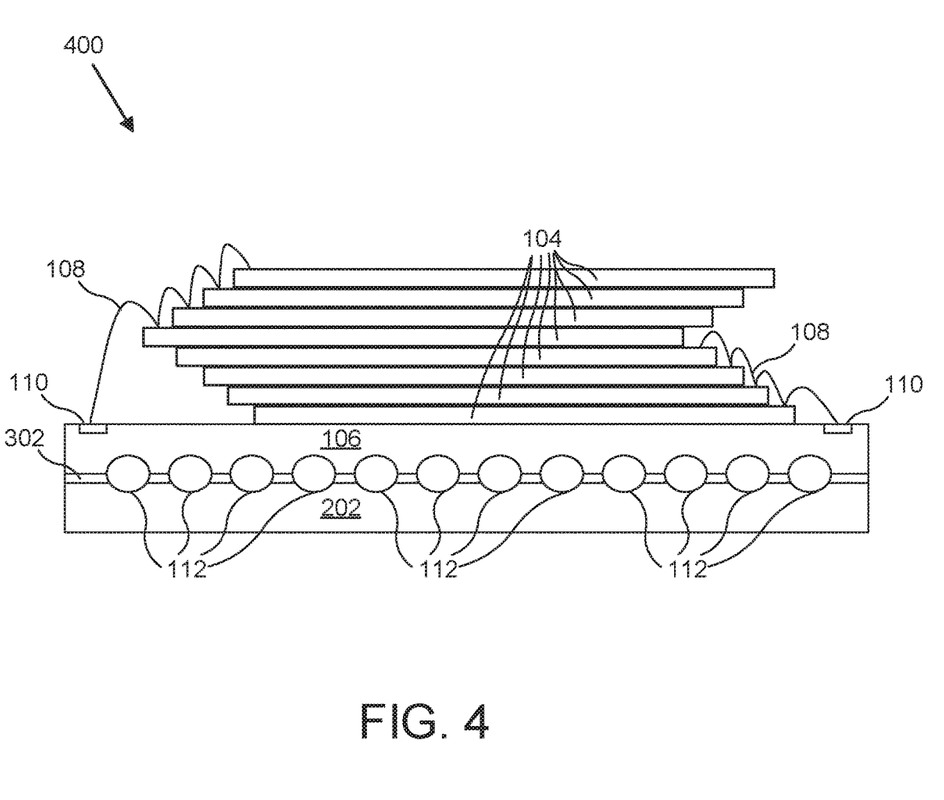
FIG. 4 is a schematic block diagram of the system joined with the PCB substrate, according to examples of the subject disclosure.

FIG. 4 is a schematic block diagram of the system 400 joined with the PCB substrate 202, according to examples of the subject disclosure. In the depicted embodiment, the DAF tape layer 302 is disposed between, and bonds together, the ICD substrate 106 with the PCB substrate 202. Upon application of heat, such as a reflow operation, the embedded solder balls 112 with start to react with the flux of the PCB substrate 202 and form an electrical connection between the ICD substrate 106 and the PCB substrate 202. In certain examples, the flux is embedded during manufacture of the PCB substrate 202. In other examples, the flux is deposited prior to the reflow operation.

In some examples, each of the integrated circuit dies 104 has an electrical contact disposed along an edge of the respective integrated circuit die 104 which is depicted here connected to the bonding wire 108. Although a single bonding wire 108 is depicted as connecting the integrated circuit dies 104, the system 400 may include any reasonable quantity of bonding wires 108 that electrically couple the integrated circuit dies 104 to the ICD substrate 106. In certain examples, the bonding wire 108 enables electrical communication between each of the integrated circuit dies 104.

In certain examples, the ICD substrate 106 may provide electrical connections (e.g., metallic electrical traces, metalized through-silicon-vias, conductive layers, and/or other conductive pathways) between the electrical contacts 110 on the ICD substrate 106 and the solder balls 112. For example, electrical traces, through-silicon-vias, or the like may comprise a redistribution layer making electrical signals from one or more electrical contacts 110. One or more integrated circuit dies 104 may comprise electrical interconnects, such as the depicted bonding wire 108 interconnects, between different integrated circuit dies 104, so that one integrated circuit die 104 may send data to one or more other integrated circuit dies 104 independently of and/or in addition to communicating through the ICD substrate 106.

Figure 5:
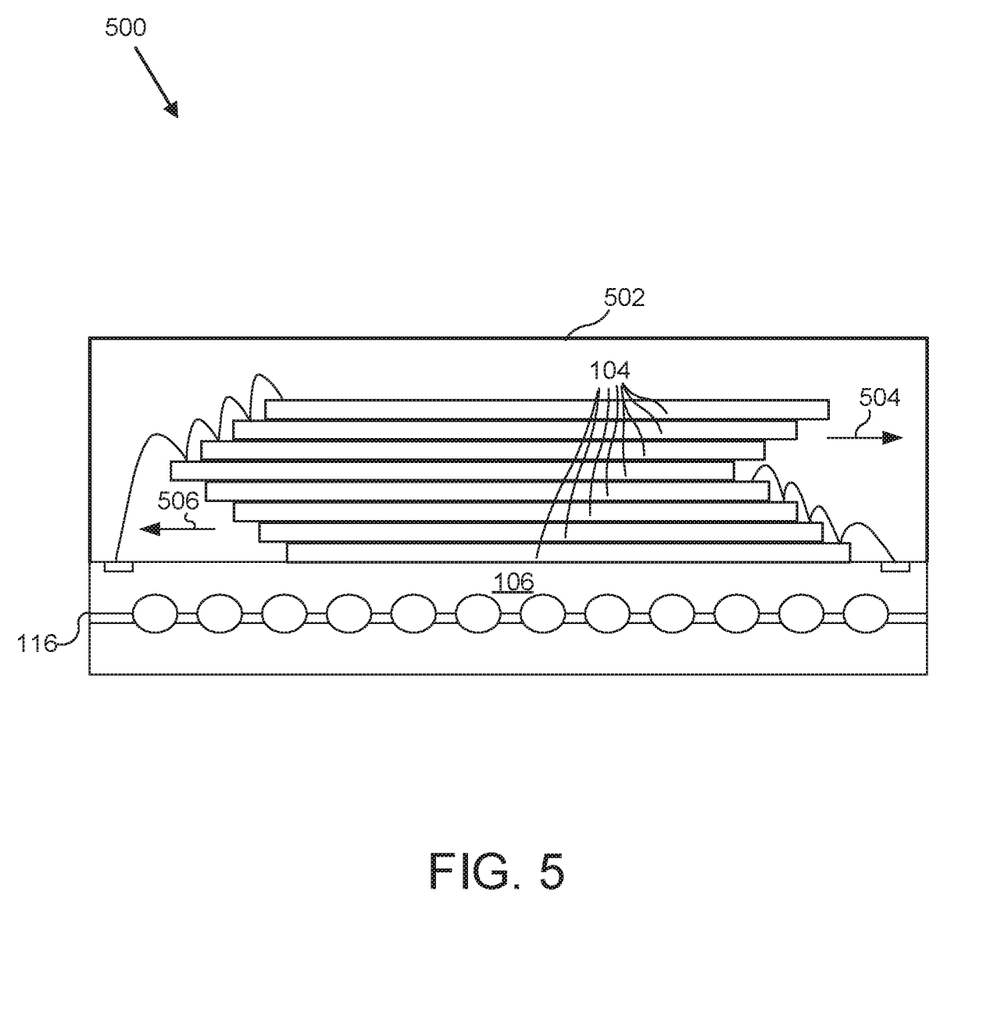
FIG. 5 is a schematic block diagram illustrating a packaged device having an encapsulation material for a stack of integrated circuit dies.

FIG. 5 is a schematic block diagram illustrating a packaged device 500 having an encapsulation material 502 for a stack of integrated circuit dies 104. The encapsulation material 502 may comprise a resin, plastic or other polymer, ceramic, and/or other sturdy material that houses and/or encapsulates the integrated circuit dies 104, with one or more electrical traces, pins, contacts, or the like extending from the integrated circuit dies 104 (e.g., through the integrated circuit dies 104 and/or the ICD substrate 106) through the packaged device 500 or other housing for external electrical communications out of the package.

In the depicted embodiment of the packaged device 500, the encapsulation material 502 encircles the integrated circuit dies 104, but not the ICD substrate 106. That is, a bottom surface 116 of the ICD substrate 106 is exposed. In other embodiments, the encapsulation material 502 may partially encapsulate the ICD substrate 106, may completely encapsulate the ICD substrate 106, or the like.

Multiple chips, die planes, dies and/or other integrated circuit dies 104, in one embodiment, may be stacked or otherwise combined in a multi integrated circuit die 104 arrangement within the encapsulation material 502. For example, multiple integrated circuit dies 104 may be stacked and laterally offset relative to each other, to provide room for electrical connections. In certain examples a first portion of the integrated circuit dies 104 are offset forming "steps" or a ramp in a first direction 504, and a second portion of the integrated circuit dies 104 are offset in a second direction 506. The first portion may be coupled to the second portion to form exposed edges on both sides of the stack of integrated circuit devices 104.

In some embodiments, multiple integrated circuit dies 104 may be coupled, either directly or indirectly, to the same ICD substrate 106 or chip carrier, and may communicate with each other through the ICD substrate 106 and/or chip carrier. Multiple integrated circuit dies 104 may be disposed within the same package and/or housing (e.g., for protection, mechanical support, or the like), such as a resin, plastic or other polymer, ceramic, and/or other sturdy material that houses and/or encapsulates the integrated circuit dies 104, with one or more electrical traces, pins, contacts, or the like extending from the integrated circuit dies 104 through the package or other housing for external electrical communications out of the package.

Figure 6:
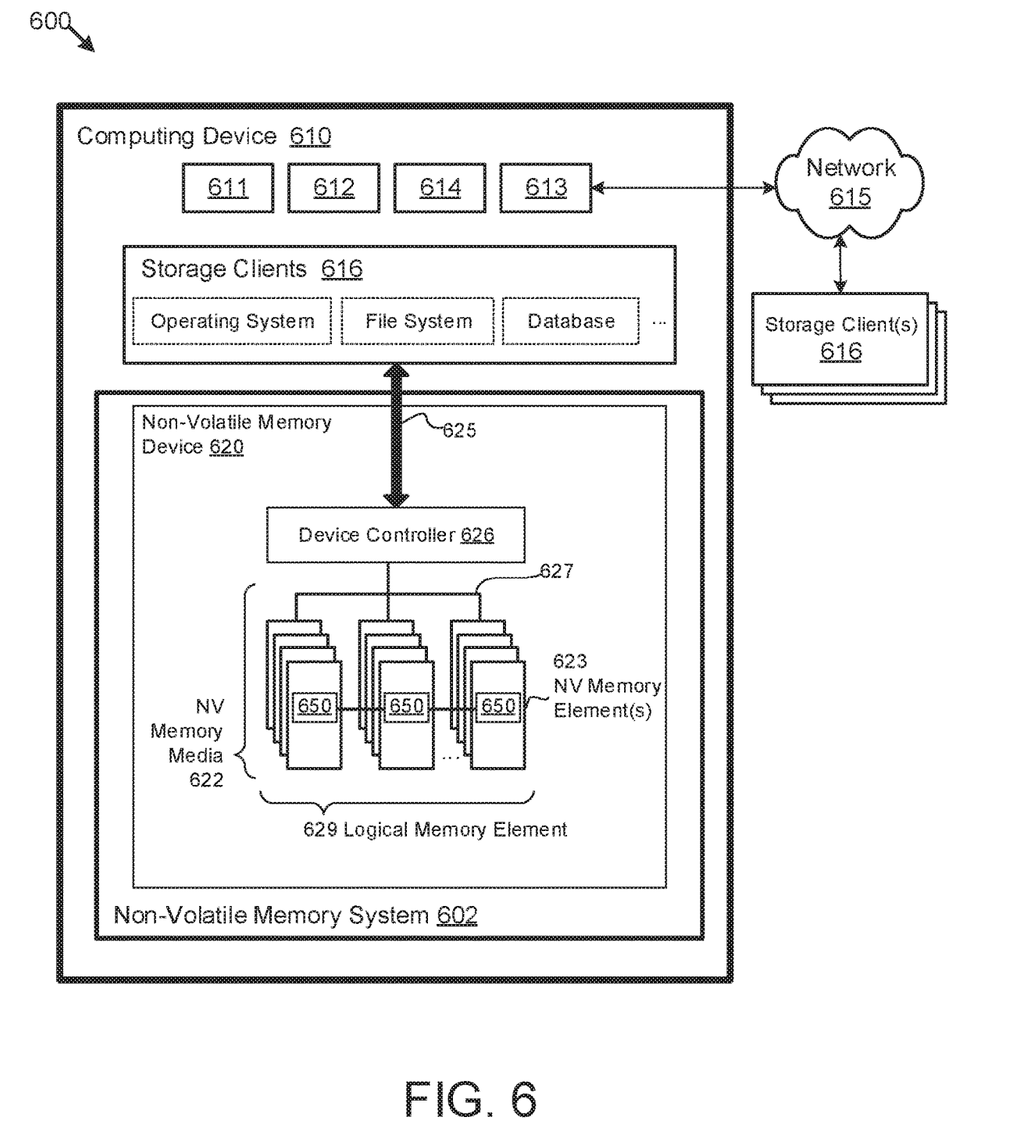
FIG. 6 is a schematic block diagram of one embodiment of a computing system for implementing the above described embedded solder ball system, according to examples of the subject disclosure.

FIG. 6 is a schematic block diagram of one embodiment of a computing system 600 for implementing the above described embedded solder ball system, according to examples of the subject disclosure. While a memory device 602 of a computing system 600 is used herein as one example of a system for a plurality of stacked integrated circuit dies 104, in other embodiments, the plurality of integrated circuit dies 104 may comprise one or more network interface controller (NIC) integrated circuit dies 104, one or more graphical processing unit (GPU) integrated circuit dies 104, one or more central processing unit (CPU) integrated circuit dies 104, and/or one or more other types of integrated circuit dies 104 that transmit and/or receive data.

In some embodiments, a memory system 602 of a computing device 610 may comprise a processor 611, volatile memory 612, and a communication interface 613. The processor 611 may comprise one or more central processing units, one or more general-purpose processors, one or more application-specific processors, one or more virtual processors (e.g., the computing device 610 may be a virtual machine operating within a host), one or more processor cores, or the like. The communication interface 613 may comprise one or more network interfaces configured to communicatively couple the computing device 610 and/or device 626 to a communication network 615, such as an Internet Protocol (IP) network, a Storage Area Network (SAN), wireless network, wired network, or the like.

The memory device 620, in various embodiments, may be disposed in one or more different locations relative to the computing device 610. In one embodiment, the memory device 620 comprises one or more volatile and/or non-volatile memory elements 623 (e.g., the stacked integrated circuit dies 104), such as semiconductor chips, dies, packages, or other integrated circuit devices disposed on one or more printed circuit boards, storage housings, and/or other mechanical and/or electrical support structures. For example, the memory device 620 may comprise one or more direct inline memory module (DIMM) cards, one or more expansion cards and/or daughter cards, a memory card, a universal serial bus (USB) drive, a solid-state-drive (SSD) or other hard drive device, and/or may have another memory and/or storage form factor. The memory device 620 may be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, may be disposed on a memory bus of a processor 611 (e.g., on the same memory bus as the volatile memory 612, on a different memory bus from the volatile memory 612, in place of the volatile memory 612, or the like). In a further embodiment, the memory device 620 may be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 may be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

One or more integrated circuit dies 104 may comprise electrical interconnects (e.g., one or more local buses, back channels, sub-networks, internal networks, internal buses, bond wires, circuit traces, or the like) between the integrated circuit dies 104, so that one (e.g., an active integrated circuit) may send data to one or more other integrated circuit dies 104, and the integrated circuit dies 104 may transmit the data in parallel (e.g., to a device controller 626, to a processor 611, to a computer readable storage medium 614, over a data network 615, over a bus 625, or the like).

According to various embodiments, a device controller 626 may manage one or more memory devices 620, memory elements (e.g., integrated circuit dies 104), and/or other integrated circuit devices. The memory device(s) 620 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units may include, but are not limited to: pages, memory divisions, blocks, sectors, collections or sets of physical storage locations (e.g., logical pages, logical blocks), or the like.

The communication interface 613 may comprise one or more network interfaces configured to communicatively couple the computing device 610 and/or the device controller 626 to a network 615 and/or to one or more remote, network-accessible storage clients 616. The storage clients 616 may include local storage clients 616 operating on the computing device 610 and/or remote, storage clients 616 accessible via the network 615 and/or the communication interface 613. The device controller 626 is part of and/or in communication with one or more memory devices 620. Although FIG. 6 depicts a single memory device 620, the disclosure is not limited in this regard and could be adapted to incorporate any number of memory devices 620.

The memory device 620 may comprise one or more integrated circuit dies 104 of volatile and/or non-volatile memory media 622, which may include but is not limited to: volatile memory such as SRAM and/or DRAM; non-volatile memory such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), and/or optical storage media; or other memory and/or storage media. The one or more integrated circuit dies 104 of memory media 622, in certain embodiments, comprise storage class memory (SCM).

While the memory media 622 is referred to herein as "memory media," in various embodiments, the memory media 622 may more generally comprise one or more volatile and/or non-volatile recording media capable of recording data, which may be referred to as a memory medium, a storage medium, or the like. Further, the memory device 620, in various embodiments, may comprise a recording device, a memory device, a storage device, or the like. Similarly, a memory element 623, in various embodiments, may comprise a recording element, a memory element, a storage element, or the like. In other embodiments, a memory element 623 may comprise a different type of integrated circuit device (e.g., an ASIC, a CPU, a communications device, a graphics device, a system on a chip, a programmable logic device, or the like), and memory elements 623 are used only by way of example as one type of integrated circuit device 623 (e.g., integrated circuit die, chip, die plane, package, or the like), and other types of integrated circuit devices are contemplated within the scope of this disclosure.

The memory media 622 may comprise one or more memory elements 623, which may include, but are not limited to: chips, packages, dies, die planes, or the like. A device controller 626 may be configured to manage data operations on the memory media 622, and may comprise one or more processors, programmable processors (e.g., FPGAs), ASICs, micro-controllers, or the like. In some embodiments, the device controller 626 is configured to store data on and/or read data from the memory media 622, to transfer data to/from the memory device 620, and so on.

The device controller 626 may be communicatively coupled to the memory media 622 and/or other integrated circuit dies 104 by way of a bus 627. The bus 625 may comprise an I/O bus for communicating data to/from the integrated circuit dies 104. The bus 627 may further comprise a control bus for communicating addressing and other command and control information to the integrated circuit dies 104. In some embodiments, the bus 627 may communicatively couple the integrated circuit dies 104 to the device controller 626 in parallel. This parallel access may allow the integrated circuit 623 to be managed as a group (e.g., in an embodiment where the integrated circuit dies 104 comprise memory elements, forming a logical memory element 629, or the like). A logical memory element 629 may be partitioned into respective logical memory units (e.g., logical pages) and/or logical memory divisions (e.g., logical blocks). The logical memory units may be formed by logically combining physical memory units of each of the integrated circuit dies 104.

Figure 7:
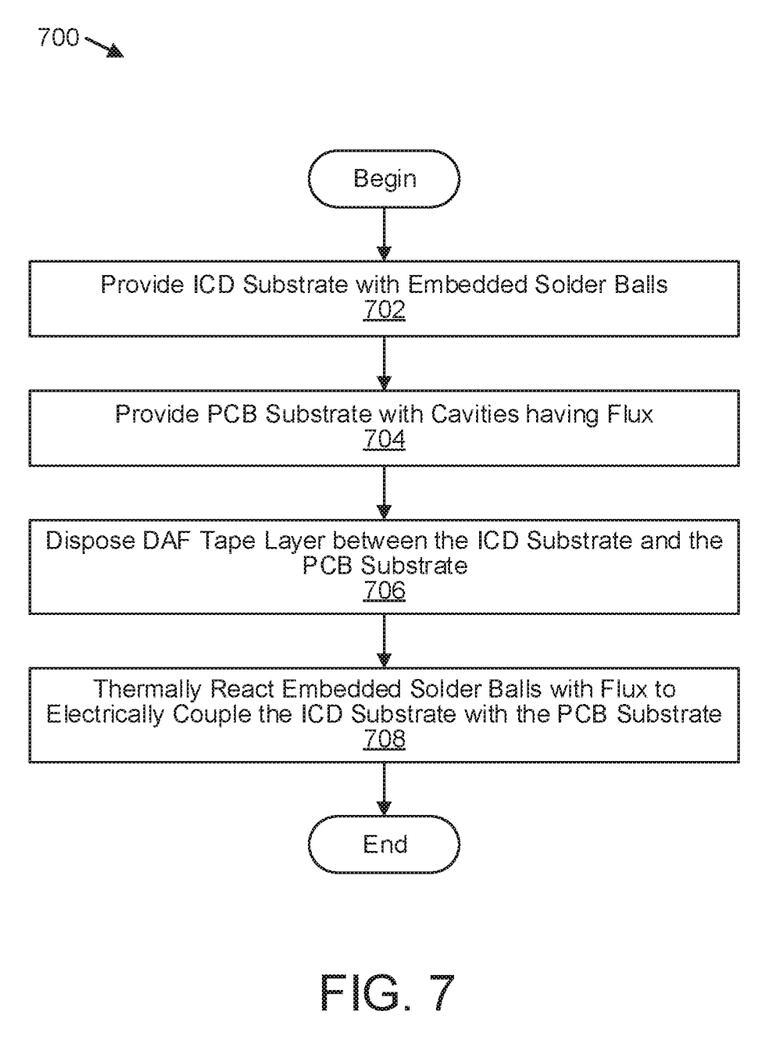
FIG. 7 is a flow chart illustrating one embodiment of a method for forming embedded solder balls in an ICD substrate, according to examples of the subject disclosure.

FIG. 7 is a flow chart illustrating one embodiment of a method 700 for forming embedded solder balls in an ICD substrate, according to examples of the subject disclosure. A manufacturer (e.g., an assembly house), as used herein, comprises a factory that takes wafers having a plurality of integrated circuit dies and packaging the dies into integrated circuit devices, such as solid-state memory devices.

The method 700 begins and a manufacturer forms provides 702 an ICD substrate 106 with embedded solder balls 112. In certain examples, the manufacturer creates a substrate with openings via standard lithography processes for receiving solder. Alternatively, the manufacturer drills, grinds, or laser ablates the openings. In yet another example, the manufacturer may use chemical vapor deposition to form the substrate 106 around a grid array of solder balls 112.

In certain examples, the manufacturer provides 704 a PCB substrate 202 with cavities for containing flux. For example, the manufacturer may deposit flux in liquid, solid, or semi-solid (e.g., paste) form into the cavities of the PCB substrate 202. The manufacturer may dispose 706 a DAF tape layer 302 between the ICD substrate 106 and the PCB substrate 202. The manufacturer thermally reacts 708 the embedded solder balls with the flux to electrically couple the ICD substrate 106 with the PCB substrate 202.

A means for supporting a plurality of integrated circuit dies 104, in various embodiments, may include the ICD substrate 106, the encapsulation material 502, the PCB substrate 202, and/or another hardware device. Other embodiments may include similar or equivalent means for supporting a plurality of integrated circuit dies 104.

A means for exposing a surface 114 of each of a plurality of solder balls 112 that are embedded within a means for supporting a plurality of integrated circuit dies 104, in various embodiments, may include where each surface 114 of the plurality of solder balls 112 is substantially flat, where a surface 114 of each of the plurality of solder balls 112 is disposed in a bottom surface 116 of the means for supporting a plurality of integrated circuit dies 104 or within a top surface 203 of the PCB substrate 202, and/or other arrangements of exposed solder balls 112. Other embodiments may include similar or equivalent means for exposing a surface 114 of each of a plurality of embedded solder balls 112.

A means for storing flux in a plurality of cavities 204, in various embodiments, may include one or more cavities 204 in a top surface of a PCB substrate 202, one or more openings formed in an ICD substrate 106, and/or one or more other cavities/openings for storing flux. Other embodiments may include similar or equivalent means for storing flux.

A means for adhering a means for supporting a plurality of integrated circuit dies 104 to a means for storing flux, in various embodiments, may include a DAF tape layer 302, other adhesives, the solder balls 112, and/or another adhesive. Other embodiments may include similar or equivalent means for adhering together the means for supporting the plurality of integrated circuit dies 104 with a means for storing flux.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus, comprising:
   an integrated circuit die (ICD) substrate having a top surface and a bottom surface;
   a plurality of solder balls at least partially embedded in the ICD substrate, where each of the plurality of solder balls comprises an exposed surface that is substantially flat and parallel planar to the bottom surface, and where the exposed surface of each of the plurality of solder balls is disposed in the bottom surface;
   a plurality of integrated circuit dies stacked on the top surface of the ICD substrate;
   a printed circuit board (PCB) substrate, where the PCB substrate comprises:
   a top surface and a bottom surface;
   a plurality of cavities formed in the top surface that each correspond to and align with one of the plurality of solder balls; and
   a die attach film (DAF) tape layer disposed on the top surface of the PCB substrate, where the DAF tape layer includes an opening for each cavity of the plurality of cavities.

2. The apparatus of claim 1, where the plurality of solder balls forms a ball grid array of solder balls.

3. The apparatus of claim 2, where the plurality of cavities receive flux.

4. The apparatus of claim 3, where the flux is disposed in each of the plurality of cavities and forms an exposed flux surface that is substantially parallel planar to the top surface of the PCB substrate.

5. The apparatus of claim 4, where each opening of the DAF tape layer exposes the exposed flux surface.

6. The apparatus of claim 1, where each of the plurality of integrated circuit dies are stacked and laterally offset relative to an adjacent one of the plurality of integrated circuit dies such that a plurality of electrical contacts along edges of the plurality of integrated circuit dies are exposed and coupled to a bonding wire.

7. The apparatus of claim 6, where a first portion of the plurality of integrated circuit dies are laterally offset in a first direction to expose a first edge of each of the plurality of integrated circuit dies, and a second portion of the plurality of integrated circuit dies are laterally offset in a second direction to expose a second edge of each of the plurality of integrated circuit dies.

8. The apparatus of claim 6, where the bonding wire electrically couples each of the plurality of integrated circuit dies with the ICD substrate to enable electrical communication between each of the plurality of integrated circuit dies and the ICD substrate.

9. The apparatus of claim 1, further comprising an encapsulation material formed around the plurality of integrated circuit dies.

10. A system, comprising:
    an integrated circuit die (ICD) substrate having a top surface for supporting a plurality of integrated circuit dies, and a bottom surface;
    a plurality of solder balls at least partially embedded in the ICD substrate, where each of the plurality of solder balls comprises an exposed surface that is substantially flat and parallel planar to the bottom surface, and where the exposed surface of each of the plurality of solder balls is disposed in the bottom surface;
    a printed circuit board (PCB) substrate having a plurality of cavities configured to store flux; and
    a die attach film (DAF) tape layer disposed between the ICD substrate and the PCB substrate, where the DAF tape layer comprises a plurality of openings that each correspond with one of the plurality of cavities.

11. The system of claim 10, where the plurality of solder balls forms a grid array of solder balls.

12. The system of claim 11, where the PCB substrate further comprises a top surface and a bottom surface, and where the plurality of cavities forms a grid array that corresponds to and aligns with the ball grid array of solder balls.

13. The system of claim 12, where the flux is disposed in each of the plurality of cavities and forms an exposed flux surface that is substantially parallel planar to the top surface of the PCB substrate.

14. The system of claim 13, where the plurality of openings expose the exposed flux surface.

15. The system of claim 10, where each of the plurality of integrated circuit dies are stacked and laterally offset relative to an adjacent one of the plurality of integrated circuit dies such that a plurality of electrical contacts along edges of the plurality of integrated circuit dies are exposed and coupled to a bonding wire.

16. The system of claim 15, where a first portion of the plurality of integrated circuit dies are laterally offset in a first direction to expose a first edge of each of the plurality of integrated circuit dies, and a second portion of the plurality of integrated circuit dies are laterally offset in a second direction to expose a second edge of each of the plurality of integrated circuit dies.

17. The system of claim 15, where the bonding wire electrically couples each of the plurality of integrated circuit dies with the substrate to enable electrical communication between each of the plurality of integrated circuit dies and the ICD substrate.

18. The system of claim 10, further comprising an encapsulation material formed around the plurality of integrated circuit dies.

\* \* \* \* \*